United States Patent
Bartonek et al.

(10) Patent No.: US 10,320,176 B2
(45) Date of Patent: Jun. 11, 2019

(54) METHOD FOR DISTINGUISHING AN ARC FROM A LUMINOUS GAS CONTAINING AT LEAST METAL VAPOR

(71) Applicant: Eaton Industries (Austria) GmbH, Schrems (AT)

(72) Inventors: Michael Bartonek, Vienna (AT); Wolfgang Hauer, Vorderweissenbach (AT)

(73) Assignee: EATON INTELLIGENT POWER LIMITED, Dublin (IE)

( * ) Notice: Subject to any disclaimer, the term of this patent is extended or adjusted under 35 U.S.C. 154(b) by 281 days.

(21) Appl. No.: 15/507,809

(22) PCT Filed: Sep. 4, 2015

(86) PCT No.: PCT/EP2015/070254
§ 371 (c)(1),
(2) Date: Mar. 1, 2017

(87) PCT Pub. No.: WO2016/034712
PCT Pub. Date: Mar. 10, 2016

(65) Prior Publication Data
US 2017/0279260 A1    Sep. 28, 2017

(30) Foreign Application Priority Data
Sep. 4, 2014   (DE) .................. 10 2014 112 723

(51) Int. Cl.
*G01R 31/12*   (2006.01)
*G01R 15/24*   (2006.01)
(Continued)

(52) U.S. Cl.
CPC ......... *H02H 1/0023* (2013.01); *G01R 15/247* (2013.01); *G01R 31/1218* (2013.01); *H02H 3/16* (2013.01)

(58) Field of Classification Search
CPC .................. H02H 9/08; G01R 31/00
(Continued)

(56) References Cited

U.S. PATENT DOCUMENTS

| 4,160,163 A | 7/1979 | Nakauchi |
| 4,289,188 A | 9/1981 | Mizutani et al. |

(Continued)

FOREIGN PATENT DOCUMENTS

| CH | 676174 A | 12/1990 |
| DE | 1133571 B | 7/1962 |

(Continued)

OTHER PUBLICATIONS

UK Patent application; GB2419665; An environment light detector having light sensors in which at least one sensor measures light outside the visible range; Publication Date: May 3, 2006; (Year: 2006).*

*Primary Examiner* — Dharti H Patel
(74) *Attorney, Agent, or Firm* — Leydig, Voit & Mayer, Ltd.

(57) ABSTRACT

A method for distinguishing an arc from a luminous gas at least containing metal vapor includes sensing light in a monitoring region and determining a first intensity $I_{\lambda 1}$ of the sensed light at a first wavelength $\lambda 1$ and a second intensity $I_{\lambda 2}$ of the sensed light at a second, greater wavelength $\lambda 2$. The ratio $I_{\lambda 1}/I_{\lambda 2}$ between the first intensity $I_{\lambda 1}$ and the second intensity $I_{\lambda 2}$ is determined. The sensed light is associated with an arc if said ratio $I_{\lambda 1}/I_{\lambda 2}$ is greater than a specifiable first threshold value and/or with a luminous gas at least containing metal vapor if said ratio $I_{\lambda 1}/I_{\lambda 2}$ is less than a specifiable second threshold value.

15 Claims, 2 Drawing Sheets

(51) Int. Cl.
*H02H 3/16* (2006.01)
*H02H 1/00* (2006.01)

(58) Field of Classification Search
USPC ........................................................ 361/93.1
See application file for complete search history.

(56) References Cited

U.S. PATENT DOCUMENTS

| | | | |
|---|---|---|---|
| 5,753,092 A | 5/1998 | Hollars et al. | |
| 6,229,680 B1* | 5/2001 | Shea | H02H 1/0023 |
| | | | 250/227.11 |
| 2008/0094612 A1* | 4/2008 | Land | G01J 1/429 |
| | | | 356/51 |
| 2011/0040508 A1 | 2/2011 | Lee et al. | |
| 2011/0090503 A1 | 4/2011 | Lee et al. | |
| 2012/0300204 A1 | 11/2012 | Van Driel et al. | |

FOREIGN PATENT DOCUMENTS

| | | |
|---|---|---|
| DE | 1142711 B | 1/1963 |
| DE | 2737090 A1 | 8/1978 |
| DE | 3019583 A1 | 12/1980 |
| DE | 3315481 A1 | 10/1984 |
| DE | 19781974 C2 | 1/2002 |
| DE | 102006053774 A1 | 5/2008 |
| DE | 102010016036 A1 | 2/2011 |
| DE | 102010016039 A1 | 6/2011 |
| DE | 102010008839 A1 | 8/2011 |
| EP | 1538722 A2 | 6/2005 |
| EP | 2140964 A1 | 1/2010 |
| GB | 2419665 A | 5/2006 |
| GB | 2477970 A | 8/2011 |

\* cited by examiner

METHOD FOR DISTINGUISHING AN ARC FROM A LUMINOUS GAS CONTAINING AT LEAST METAL VAPOR

CROSS-REFERENCE TO RELATED APPLICATIONS

This application is a U.S. national stage application under 35 U.S.C. § 371 of International Application No. PCT/EP2015/070254, filed on Sep. 4, 2015, and claims benefit to German Patent Application No. DE 10 2014 112 723.4, filed on Sep. 4, 2014. The International Application was published in German on Mar. 10, 2016, as WO 2016/034712 A1 under PCT Article 21(2).

FIELD

The invention relates to a method and to a device for detecting an arc, and to a switch cabinet comprising at least one switching device and comprising a connected device of the specified type.

BACKGROUND

Such a method and such a device are generally known in the art and are, for example, used in electrical systems to protect people and/or the system itself, for instance, from the destructive effects of an arc caused by a short circuit or to mitigate its effects at the very least. For example, animals or even dropped tools and (damp) dirt can reduce the insulation or spark gap between two conductors having different voltage potentials such that an arc is formed. The very high currents resulting in some cases can lead to powerful explosions due to the air heating up in a very short space of time.

Electrical systems are therefore often monitored to prevent such an arc occurring, and in many cases this is achieved by measuring the current flowing through the electrical conductors and detecting the extremely intensive light resulting from an arc. If both criteria are fulfilled, an alarm signal or a switching signal is issued to close a switch between said conductors having different voltage potentials. On the one hand, this causes the arc to be extinguished quickly; on the other hand, it also causes very high currents to occur in the supply lines, which trip a higher-level circuit breaker, which ultimately isolates the danger area from the network. Of course, said switching signal can also be used to directly open a switch or a plurality of switches in the supply lines leading to the arc.

In principle, there are a number of publications on this subject in the prior art. For example, U.S. Pat. No. 6,229,680 B1 discloses a system for optical arc detection in which the light received by a measurement point is split and passed through two different band-pass filters. If the difference between the electrical signal resulting from the received light and the electrical signal resulting from a background light exceeds a threshold value, an arc detection signal is issued.

EP 1 538 722 A2 also discloses a system for arc detection in which the light received by a measurement point is combined with a modulated reference light source and then split and passed through two band-pass filters. If a first electrical signal, which represents light at a first wavelength, exceeds a second electrical signal that represents light at a second wavelength excluding the modulated reference light, an alarm is issued.

CH 676174 A also discloses the use of a band-pass filter to limit the light received by a measurement point to an arc wavelength range.

Furthermore, DE 10 2010 016 036 A1 discloses a color sensor comprising a red filter, a green filter and a blue filter for detecting an arc.

Finally, GB 2477970 A discloses an optical fiber having a fluorescent material which transforms light in a wavelength range that is characteristic of an arc into light that has a different wavelength. This transformed light is then passed to an optical sensor.

As a general rule, it is difficult to detect a dangerous, short-circuiting arc with any degree of certainty using methods in the prior art. This is because, in electrical systems, arcing can occur even during normal operation, for example in the form of switching arcs when disconnecting a live switching contact. The arc in a switching device itself is admittedly not directly visible, although luminous gas can be emitted by the switching device, said gas containing at least metal vapor which originates from the burning switching contacts, or arc deflectors or arc splitters, in the switching device. In addition, the gas may also contain other constituents, for example evaporated plastics from the housing of the switching device.

This luminous gas may erroneously be interpreted as dangerous arcing, leading to an electrical system which is actually working normally being shut down unnecessarily. In the prior art, this kind of malfunction can in particular be observed if a phase-to-earth short circuit (without arcing or with arcing outside the switch cabinet) causes a very high measurable current in the supply line and also causes an associated circuit breaker to trip. The luminous gases emitted by the circuit breaker seem to fulfil the two conditions (high current and bright light) mentioned at the outset for a dangerous arc.

SUMMARY

An aspect of the invention provides a method for distinguishing an arc from a luminous gas including a metal vapor, the method comprising: sensing light in a monitoring region; measuring a first intensity $I_{\lambda 1}$ of the sensed light at a first wavelength $\lambda 1$; measuring a second intensity $I_{\lambda 2}$ of the sensed light at a second, greater wavelength $\lambda 2$; determining a ratio $I_{\lambda 1}/I_{\lambda 2}$ between the first intensity $I_{\lambda 1}$ and the second intensity $I_{\lambda 2}$; and associating the sensed light with the arc if the ratio $I_{\lambda 1}/I_{\lambda 2}$ is greater than a specifiable first threshold value and/or with the luminous gas if the ratio $I_{\lambda 1}/I_{\lambda 2}$ is less than a specifiable second threshold value.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
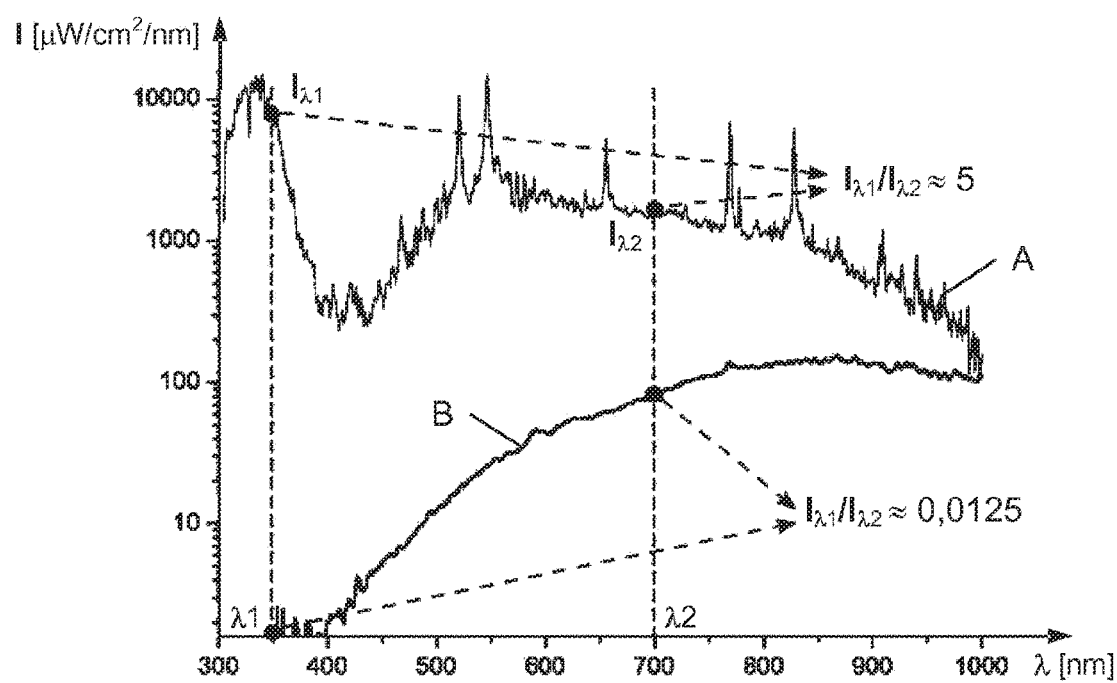
FIG. 1 an example of a diagram for the absolute spectral irradiance [$\mu W \cdot cm^{-2} \cdot nm^{-1}$] as a function of the wavelength $\lambda$ for an arc and a luminous gas.

An aspect of the invention provides an improved method and an improved device for detecting an arc. In particular, it should be possible to detect dangerous arcing with certainty and avoid shutting down an electrical system unnecessarily.

An aspect of the invention provides a method for distinguishing an arc from a luminous gas at least containing metal vapor, comprising the following steps:

sensing light in a monitoring region, measuring a first intensity $I_{\lambda 1}$ of the sensed light at a first wavelength $\lambda 1$ measuring a second intensity $I_{\lambda 2}$ of the sensed light at a second, greater wavelength $\lambda 2$ determining the ratio $I_{\lambda 1}/I_{\lambda 2}$ between the first intensity $I_{\lambda 1}$ and the second intensity $I_{\lambda 2}$ and associating the sensed light with an arc if said ratio $I_{\lambda 1}/I_{\lambda 2}$ is greater than a specifiable first threshold value and/or with a luminous gas at least containing metal vapor if said ratio $I_{\lambda 1}/I_{\lambda 2}$ is less than a specifiable second threshold value.

An aspect of the invention provides a device for distinguishing an arc from a luminous gas containing at least metal vapor, comprising at least one light-sensitive element for sensing light in a monitoring region, a measuring device for measuring a first intensity $I_{\lambda 1}$ of the sensed light at a first wavelength $\lambda 1$ and for measuring a second intensity $I_{\lambda 2}$ of the sensed light at a second, greater wavelength $\lambda 2$, and an evaluation unit for determining the ratio $I_{\lambda 1}/I_{\lambda 2}$ between the first intensity $\mathbf{1}_{\lambda 1}$ and the second intensity $\mathbf{1}_{\lambda 2}$ and for associating the sensed light with an arc if said ratio $I_{\lambda 1}/I_{\lambda 2}$ is greater than a specifiable first threshold value and/or with a luminous gas at least containing metal vapor if said ratio $I_{\lambda 1}/I_{\lambda 2}$ is less than a specifiable second threshold value.

Finally, an aspect of the invention provides a switch cabinet comprising at least one switching device which comprises a device of the above-mentioned type, having an output connected to a switch input of the at least one switching device.

Finally, an aspect of the invention provides a method of the above-mentioned type or a device of the above-mentioned type to monitor a monitoring region located in a switch cabinet.

The proposed measures make it possible to distinguish a dangerous arc with a high degree of certainty from the (potentially harmless) gases emitted by a switching device. This method makes use of the fact that the light spectrum of the luminous gas is different to the light spectrum of the arc. The temperature of the luminous (burning) gas ranges from approximately 2,500° K to 4,500° K, whereas the temperature of the arc ranges between approximately 10,000° K and 20,000° K. Accordingly, the light emitted by an arc has a higher proportion of short-wave radiation.

Advantageously, it is not necessary to use complicated spectral analyses to achieve the object of the invention. Instead, two values are determined for light intensity in two specific wavelength ranges and simple mathematical operations and comparisons are used in the manner described above to distinguish an arc from a luminous gas at least containing metal vapor. As a result, the described method is also not very susceptible to problems and can be implemented in practice with minimal technical outlay.

It should be noted at this point that the luminous gas may also, in particular, contain gaseous decomposition products of plastics, for example hydrogen, carbon, hydrocarbons and similar products in addition to metal vapor. Despite this variation in the composition of the luminous gas, the described method or the described device makes it possible to safely detect an arc or the luminous gas, or to safely distinguish the two.

In a preferred embodiment of the invention, the sensed light may be associated with an arc if said ratio $I_{\lambda 1}/I_{\lambda 2}$ lies in a first range and/or with a luminous gas at least containing metal vapor if said ratio $I_{\lambda 1}/I_{\lambda 2}$ lies in a second range. In other words, an associated upper threshold value is provided in addition to the first lower threshold value and an associated lower threshold value is provided in addition to the second upper threshold value.

Further advantageous embodiments and developments of the invention are described in the dependent claims and in the description in conjunction with the figures.

It is advantageous if the first wavelength $\lambda 1$ is selected in a range between 300 nm and 400 nm and/or the second wavelength $\lambda 2$ is selected in a range between 650 nm and 750 nm. It is particularly advantageous if $\lambda 1=350$ nm is selected as the first wavelength and/or $\lambda 2=700$ nm is selected for the second wavelength. These wavelengths or wavelength ranges have proved to be particularly suitable for distinguishing an arc from a luminous gas.

It is particularly advantageous if the first threshold value and/or the second threshold value is/are selected in a range from 0.0125 to 5. The second threshold value is in this case preferably less than or equal to the first threshold value, but in principle the second threshold value can also be greater than the first threshold value. In this range it is possible to clearly distinguish an arc from a luminous gas.

It is also advantageous if a value of 2.5 is selected for the first threshold value and/or the second threshold value. Even more preferable values for the first threshold value are 3.5 and 4.5, and 1.5 and 0.5 for the second threshold value. This is a particularly good way of successfully distinguishing an arc from a luminous gas.

It is also advantageous if the device for distinguishing an arc from a luminous gas comprises an output which is designed to issue a first alarm or a first switching signal in the event of an arc being detected in the monitoring region. Accordingly, it is advantageous if a first alarm or a first switching signal is issued if an arc is detected in the monitoring region. A higher-level control system or monitoring staff can thus be notified of the fault in the electrical system. Alternatively or in addition, the first switching signal can be sent directly to a switching device, which automatically isolates the electrical system from the power network supplying it with power in the event of a fault. It would also be conceivable to send the first switching signal to a switching device to short-circuit the arc and thus extinguish said arc. The resulting high short-circuit current leads to a circuit breaker tripping on the corresponding supply line. The first switching signal can thus cause a switching contact to close and can also cause a switching contact to open.

It is particularly advantageous if the first alarm or the first switching signal is issued if an arc is detected in the monitoring region and also if a current in excess of a third threshold value is detected in a supply line leading to the monitoring region. A dangerous situation in the monitoring region can be identified particularly effectively by incorporating a further criterion.

It is also advantageous if the device for distinguishing an arc from a luminous gas comprises an output which is designed to issue a second alarm/switching signal in the event of a luminous gas at least containing metal vapor being detected in the monitoring region and/or a third alarm/switching signal if the light sensed in the monitoring region can be associated neither with an arc nor a luminous gas at least containing metal vapor. It is accordingly advantageous if a second alarm or a second switching signal is issued if a luminous gas at least containing metal vapor is detected in the monitoring region and/or a third alarm or a third switching signal if the light sensed in the monitoring region can be associated neither with an arc nor with a luminous gas at least containing metal vapor. In specific terms, the third alarm/third switching signal is issued if the ratio $I_{\lambda 1}/I_{\lambda 2}$ lies between the first and second threshold value. If ranges of values are provided to associate the sensed light with an arc or a luminous gas at least containing metal vapor, the third alarm/third switching signal is issued if the ratio $I_{\lambda 1}/I_{\lambda 2}$ lies outside the range of values proposed for the arc or the luminous gas.

The proposed measures mean that monitoring staff or a higher-level control system can be provided with additional information which does not necessarily indicate a dangerous situation in the switch cabinet. In specific terms, the signals not only indicate an arc in the switch cabinet, but also a luminous gas emitted by a switching device and another light source, for example daylight entering the switch cabinet when said cabinet is opened or even a photo flash. The second and/or third switching signal can in turn be passed to a switching device and is able to isolate or close a power circuit.

The device for distinguishing an arc from a luminous gas advantageously comprises two light-sensitive elements and optical filters placed in front of the light-sensitive elements, the filter(s) placed in front of the first light-sensitive element predominantly allowing light at the first wavelength to pass through and the filter(s) placed in front of the second light-sensitive element predominantly allowing light at the second wavelength to pass through. In particular, the first and/or second optical filter may be designed as a band-pass filter. In this way, two light-sensitive elements having an identical design can be used to sense light from the monitoring region. In principle, however, it is also conceivable to use a high-pass filter and a low-pass filter.

It is particularly advantageous when using band-pass filters if the first optical filter allows light to pass through in a wavelength range between 300 nm and 400 nm and/or the second optical filter allows light to pass through in a wavelength range between 650 nm and 750 nm, or if the maximum transparency of the first optical filter lies in this wavelength range and in particular at 350 nm and if the maximum transparency of the second optical filter lies in the above-mentioned wavelength range and in particular at 700 nm. As already mentioned, these wavelengths or wavelength ranges have proved to be particularly suitable for distinguishing an arc from a luminous gas.

It is also particularly advantageous if the monitoring region is located inside a switch cabinet. The advantages of the invention are particularly evident in this case as the problem of safely distinguishing an arc from a luminous gas often arises inside a switch cabinet.

At this point it should be noted that the disclosed variations on the described method and the resulting advantages relate equally to the device for distinguishing an arc from a luminous gas, to the described switch cabinet and to the described use of such a method or such a device, and vice versa.

FIG. 1 shows a diagram for the absolute irradiance I as a function of the wavelength λ for an arc (Graph A) and a luminous gas at least containing metal vapor (Graph B).

In a method for distinguishing an arc from a luminous gas at least containing metal vapor,
  light is sensed in a monitoring region,
  a first intensity $I_{\lambda 1}$ of the sensed light at a first wavelength λ1 is measured,
  a second intensity $I_{\lambda 2}$ of the sensed light at a second, greater wavelength λ2 is measured,
  the ratio $I_{\lambda 1}/I_{\lambda 2}$ between the first intensity $I_{\lambda 1}$ and the second intensity $I_{\lambda 2}$ is determined and
  the sensed light is associated with an arc if said ratio $I_{\lambda 1}/I_{\lambda 2}$ is greater than a specifiable first threshold value and/or with a luminous gas at least containing metal vapor if said ratio $I_{\lambda 1}/I_{\lambda 2}$ is less than a specifiable second threshold value.

The first wavelength λ1 is preferably selected in a range between 300 nm and 400 nm and/or the second wavelength λ2 is selected in a range between 650 nm and 750 nm. In the specific example shown in FIG. 1, the values for the first wavelength are λ1=350 nm and/or λ2=700 nm for the second wavelength. In the example shown in FIG. 1 the ratio $I_{\lambda 1}/I_{\lambda 2}$ has a value of 5 for the arc (Graph A), and 0.0125 for the luminous gas (Graph B). If a value of 2.5 is selected for the first and second threshold value, the measured ratio $I_{\lambda 1}/I_{\lambda 2}$ is clearly associated with an arc or a luminous gas at least containing metal vapor. Other even more preferable values for the first threshold value are 3.5 and 4.5, and 1.5 and 0.5 for the second threshold value. As a general rule, the first and second threshold value should lie in a range between 0.0125 and 5, the second threshold value being preferably less than or equal to the first threshold value.

In the example shown, the described method thus comprises the following specific steps:
  sensing light in a monitoring region,
  measuring a first intensity $I_{\lambda 1}$ of the sensed light at a wavelength λ1=350 Nm.
  measuring a second intensity $I_{\lambda 2}$ of the sensed light at a second, greater wavelength λ2=700 nm,
  determining the ratio $I_{\lambda 1}/I_{\lambda 2}$ between the first intensity $I_{\lambda 1}$ and the second intensity $I_{\lambda 2}$ and
  associating the sensed light with an arc if said ratio $I_{\lambda 1}/I_{\lambda 2}$ is greater than 2.5 and/or with a luminous gas at least containing metal vapor if said ratio $I_{\lambda 1}/I_{\lambda 2}$ is less than 2.5.

Advantageously, to associate the light with an arc or a luminous gas, it is sufficient to measure two values for the intensity $I_{\lambda 1}/I_{\lambda 2}$ of the light in two specific wavelength ranges λ1, λ2 and carry out simple mathematical operations and comparisons. On the other hand, there is no need for complicated spectral analyses. The described method is therefore not very susceptible to problems and can be implemented in practice with minimal technical outlay, as shown in FIG. 2.

Figure 2:
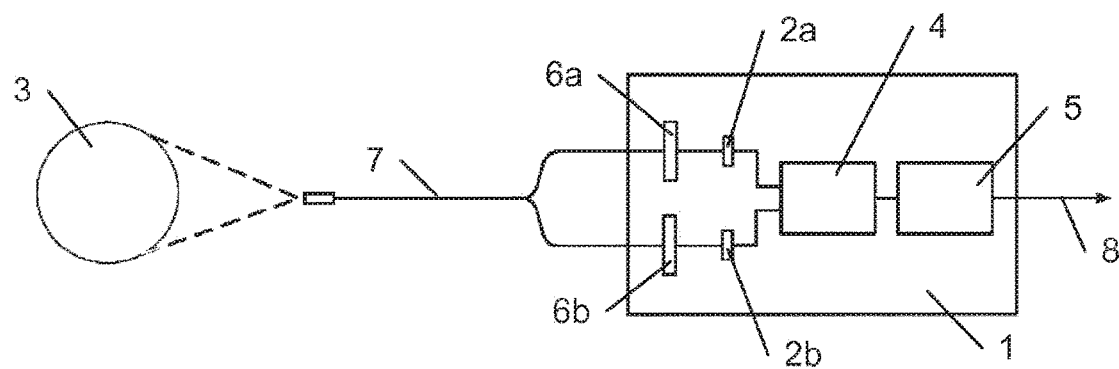
FIG. 2 an example of a device for distinguishing an arc from a luminous gas.

FIG. 2 shows an example of a device 1 for distinguishing an arc from a luminous gas at least containing metal vapor. The device 1 comprises
  two light-sensitive elements 2a, 2b for sensing light in a monitoring region (3),
  a measuring device 4 for measuring a first intensity $I_{\lambda 1}$ of the sensed light at a first wavelength λ1 and for measuring a second intensity $I_{\lambda 2}$ of the sensed light at a second, greater wavelength λ2, and an evaluation unit 5 for determining the ratio $I_{\lambda 1}/I_{\lambda 2}$ between the first intensity $I_{\lambda 1}$ and the second intensity $I_{\lambda 2}$ and for associating the sensed light with an arc if said ratio $I_{\lambda 1}/I_{\lambda 2}$ is greater than a specifiable first threshold value and/or with a luminous gas at least containing metal vapor if said ratio $I_{\lambda 1}/I_{\lambda 2}$ is less than a specifiable second threshold value.

In this example, two optical filters 6a, 6b are placed in front of the two light-sensitive elements 2a, 2b, the filter 6a placed in front of the first light-sensitive element 2a predominantly allowing light at the first wavelength λ1 to pass through and the filter 6b placed in front of the second light-sensitive element 2b predominantly allowing light at the second wavelength λ2 to pass though. In specific terms, the two optical filters 6a, 6b are advantageously designed as band-pass filters. With reference to the example shown in FIG. 1, one particular possibility is that the first filter 6a may predominantly allow light having a wavelength of λ1=350 nm to pass through and the second filter 6b may predominantly allow light having a wavelength of λ2=700 nm to pass through.

Furthermore, the device 1 is connected to an optional light conductor 7, which conducts the light from the monitoring region 3 to the optical filters 6a, 6b or to the light-sensitive elements 2a, 2b. Finally, the device 1 also comprises an optional alarm output or switching output 8.

The arrangement illustrated in FIG. 2 operates as follows:

Light is conducted from the monitoring region 3 via the light conductor 7 and the optical filters 6a, 6b to the light-sensitive elements 2a, 2b, which convert the light into an electrical signal. This electrical signal is evaluated by the measuring device 4 and converted into intensity values $I_{\lambda 1}$, $I_{\lambda 2}$ for the sensed light. The evaluation unit 5 determines the ratio $I_{\lambda 1}/I_{\lambda 2}$ between the first intensity $I_{\lambda 1}$ and the second intensity $I_{\lambda 2}$ and associates the sensed light with an arc if said ratio $I_{\lambda 1}/I_{\lambda 2}$ is greater than a specifiable first threshold value and/or with a luminous gas at least containing metal vapor if said ratio $I_{\lambda 1}/I_{\lambda 2}$ is less than a specifiable second threshold value. With reference to FIG. 1, a value of 2.5 is in particular selected for the first threshold value and the second threshold value. However, any other threshold values mentioned in connection with FIG. 1 are of course also conceivable. A first alarm or a first switching signal is preferably issued if an arc is detected in the monitoring region 3. Of course, if an arc or a luminous gas is detected, this can also be transmitted in a different manner. In particular, it is also possible to report that a luminous gas or the occurrence of light which can be associated neither with an arc nor with a luminous gas has been detected in addition to the arc or as an alternative to an arc.

As a general rule, the measuring device 4 can be designed as an analog-to-digital converter which converts the electrical signal from the light-sensitive elements 2a, 2b to a digital value, and the evaluation units 5 can be designed as a microprocessor in which a software algorithm is carried out to determine the ratio $I_{\lambda 1}/I_{\lambda 2}$ and to associate the received light with an arc or a luminous gas.

However, it would also be conceivable to use analog modules to determine the ratio $I_{\lambda 1}/I_{\lambda 2}$ and to associate the received light with an arc or a luminous gas. In this case, the measuring device 4 is primarily used to amplify the signal, but may also be omitted in principle.

It would also be conceivable to create a structural unit from a light-sensitive element 2a, 2b and a measuring device 4. For example, this structural element may issue an (amplified) analog signal or may also issue a digital value directly. In a first embodiment of the invention, a light-sensitive element 2a, 2b and an optical filter 6a, 6b may form a structural unit. For example, the housing of the light-sensitive element 2a, 2b may be correspondingly colored. It is also conceivable to combine a light-sensitive element 2a, 2b, a measuring device 4 and an optical filter 6a, 6b in a structural unit.

Finally, it is also possible to use just one light-sensitive element 2a, in front of which the optical filters 6a, 6b may be moved consecutively one after the other. For example, the filters 6a, 6b may be located on a motor-driven, rotating disc.

Figure 3:
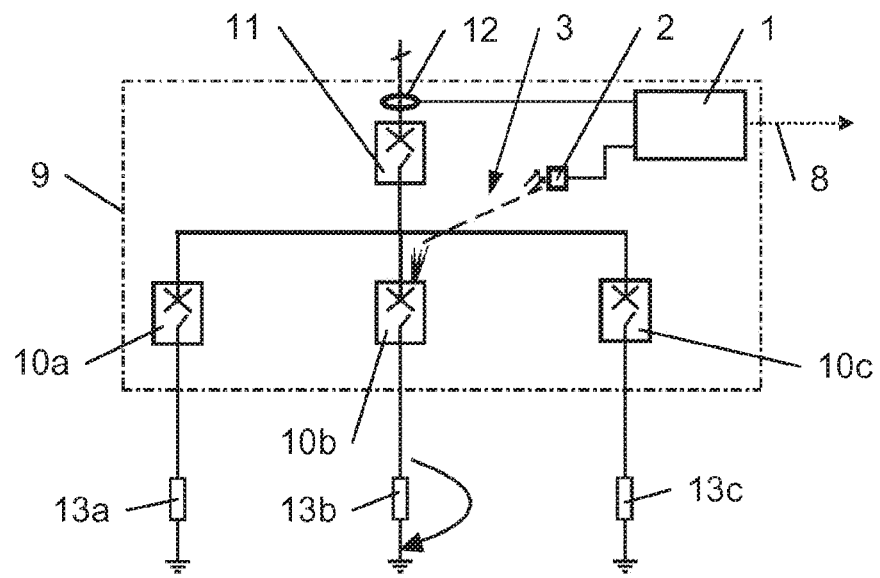
FIG. 3 an example of a switch cabinet comprising a device for distinguishing an arc from a luminous gas and FIG. 4 similar to FIG. 3, but with a device for extinguishing an arc.

FIG. 3 shows an example of a switch cabinet 9 illustrated in a purely symbolic fashion comprising three circuit breakers 10a . . . 10c each associated with one phase of a three-phase system, a higher-level circuit breaker 11, and a device 1 for distinguishing an arc from a luminous gas at least containing metal vapor, which is connected to a light-sensitive element 2 and a current measurement loop 12. In addition, said device 1 comprises an alarm output or switching output 8. Lastly, three loads 13a . . . 13c are also connected to the switch cabinet 9.

The device 1 in this example has an extended functional scope compared to the example shown in FIG. 2, due to the fact that the signal from a current measurement loop 12 is also evaluated in addition to optical monitoring of a monitoring region 3. In this example, a first alarm signal and/or a first switching signal are issued by the output 8 if an arc is detected using the method described above, AND if the current measured by the current measurement loop 12 exceeds a threshold value.

In the example shown in FIG. 3, a short circuit in the load 13b causes a higher current flow through the circuit breaker 10b, the high-level circuit breaker 11 and the current measurement loop 12. The short-circuit current trips the circuit breaker 10b, causing arcing via the resulting open contacts in a manner known per se.

The arc in the circuit breaker 10b itself is admittedly not usually directly visible to the light-sensitive element 2, although luminous gas can be emitted by the circuit breaker 10b, said gas containing at least metal vapor originating from the burning switching contacts, or arc deflectors or arc splitters in the circuit breaker 10b. In addition, the gas may also contain other constituents, for example evaporated plastics from the housing of the circuit breaker 10b.

Arc detection devices according to the prior art issue an erroneous alarm signal or switching signal in this situation, as not only is bright light detected in the switch cabinet 9, but an excessively high current is also identified by the current measurement loop 12.

However, the device 1 according to the invention is able to safely distinguish between a visible arc burning in the switch cabinet 9 and the luminous gas and in such a situation does not give rise to an erroneous alarm signal or switching signal. Said signal is only issued if an arc is visibly burning in the switch cabinet 9, for example because animals have entered the switch cabinet or tools have been dropped, causing the insulation or spark gap between two conductors having different voltage potentials to be reduced to such an extent that arcing results.

Figure 4:
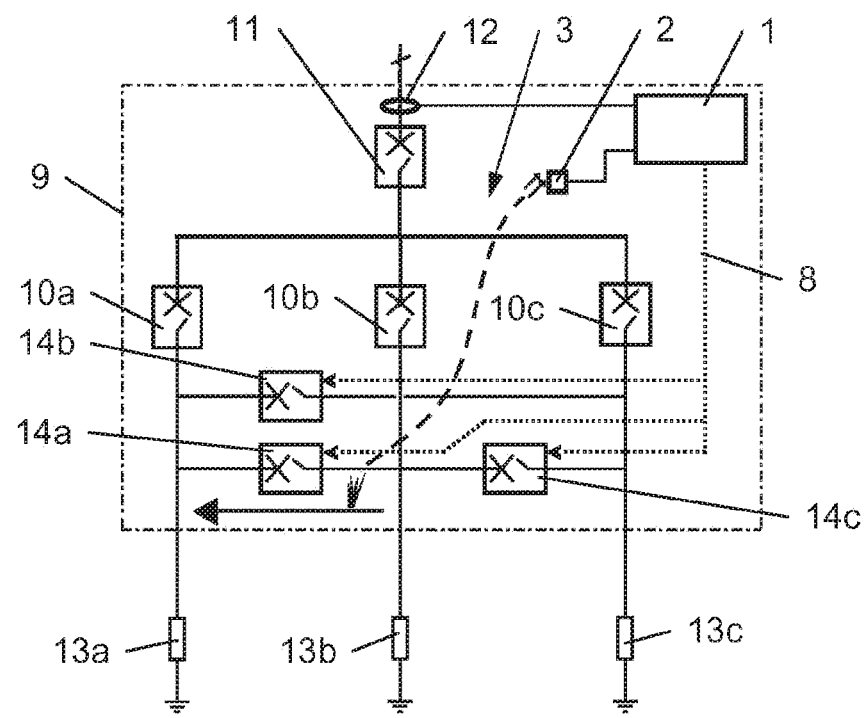

FIG. 4 shows an arrangement that is very similar to the arrangement illustrated in FIG. 3. However, this arrangement also includes the switching devices 14a . . . 14c, which are able to short-circuit the individual phases with respect to one another. In this case, for example, the first switching signal 8 can be sent to the inputs of the switching devices 14a . . . 14c. If a fault occurs, the switching devices 14a ... 14c are closed, thus extinguishing the arc burning between the phases. The overcurrent caused by the short circuit causes the circuit breakers 10a ... 10c or the circuit breaker 11 to trip, as a result of which the system is ultimately disconnected from the power network. Of course, the first switching signal 8 can also be issued by the switch cabinet 9, leading to an alarm, for example. It is also conceivable that the switching devices 14a ... 14c are connected to earth, in which case the phases can accordingly be short-circuited to earth (and with respect to one another) using the switching devices 14a ... 14c.

It should be noted at this point that not only can the formation of an arc (first alarm/first switching signal) be reported, but also the formation of a luminous gas at least containing metal vapor (second alarm/second switching signal) and the occurrence of light that is associated neither with an arc nor with a luminous gas at least containing metal vapor (third alarm/third switching signal). The principle disclosed in relation to the first alarm/first switching signal can also be applied in the same manner to the second alarm/second switching signal and to the third alarm/third switching signal. For example, the second and/or third switching signal can be passed to a switching device and is able to isolate or close a power circuit. In particular, monitoring staff or a higher-level control system can be provided with additional information in this manner which does not necessarily indicate a dangerous situation in the switch cabinet 9. In specific cases, for example, daylight entering the switch cabinet 9 when opening said cabinet or even a photo flash can be identified and reported.

Finally, it should be noted that the device 1 and the switch cabinet 9 or their components are not necessarily shown to scale and therefore may also assume different proportions. Moreover, a device 1 for distinguishing an arc from a luminous gas or the switch cabinet 9 may also comprise more or fewer components than illustrated. References to positions (e.g. "top", "bottom", "left", "right", etc.) refer to the specific figure being described and should be adapted accordingly to the new position if said position changes. Finally, it should be noted that the above embodiments and developments of the invention can be combined in any manner.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B, and C" should be interpreted as one or more of a group of elements consisting of A, B, and C, and should not be interpreted as requiring at least one of each of the listed elements A, B, and C, regardless of whether A, B, and C are related as categories or otherwise. Moreover, the recitation of "A, B, and/or C" or "at least one of A, B, or C" should be interpreted as including any singular entity from the listed elements, e.g., A, any subset from the listed elements, e.g., A and B, or the entire list of elements A, B, and C.

The invention claimed is:

1. A method for distinguishing an arc from a luminous gas including a metal vapor, the method comprising:
    sensing light in a monitoring region;
    measuring a first intensity $I_{\lambda 1}$ of the sensed light at a first wavelength $\lambda 1$;
    measuring a second intensity $I_{\lambda 2}$ of the sensed light at a second, greater wavelength $\lambda 2$;
    determining a ratio $I_{\lambda 1}/I_{\lambda 2}$ between the first intensity $I_{\lambda 1}$ and the second intensity $I_{\lambda 2}$; and
    associating the sensed light with the arc if the ratio $I_{\lambda 1}/I_{\lambda 2}$ is greater than a specifiable first threshold value and/or with the luminous gas if the ratio $I_{\lambda 1}/I_{\lambda 2}$ is less than a specifiable second threshold value.

2. The method of claim 1, wherein the first wavelength $I\lambda 1$ is a range of from 300 to 400 nm and/or the second wavelength $I_{\lambda 2}$ is selected in a range between 650 nm and 750 nm.

3. The method of claim 1, wherein or the first threshold value and/or the second threshold value is in a range of from 0,0125 to 5.

4. The method of claim 1, wherein the first threshold value and/or the second threshold value is 2.5.

5. The method of claim 1, further comprising:
    issuing a first alarm or a first switching signal if the arc is detected in a monitoring region.

6. The method of claim 5, wherein the first alarm or a first switching signal is issued if the arc is detected in the monitoring region and also if a current in excess of a third threshold value is detected in a supply line leading to the monitoring region.

7. The method of claim 1, further comprising:
    issuing a second alarm or a second switching signal if the luminous gas is detected in a monitoring region;
    and/or
    issuing a third alarm or a third switching signal if a light sensed in the monitoring region can be associated neither with the arc nor the luminous gas.

8. The method of claim 1, wherein a monitoring region is located inside a switch cabinet.

9. A method of monitoring a monitoring region located in a switch cabinet, the method comprising:
    arranging the device of claim 1 in a monitoring range of the monitoring region.

10. A device for distinguishing an arc from a luminous gas including a metal vapor, the device comprising:
    at least one light-sensitive element configured to sense light in a monitoring region;
    a measuring device configured to measure a first intensity $I_{\lambda 1}$ of sensed light at a first wavelength $I\lambda 1$ and to measure a second intensity $I_{\lambda 2}$ of the sensed light at a second, greater wavelength $I\lambda 2$;
    an evaluation unit configured to determine a ratio $I_{\lambda 1}/I_{\lambda 2}$ between the first intensity $I_{\lambda 1}$ and the second intensity $I_{\lambda 2}$ and to associate the sensed light with the arc if the ratio $I_{\lambda 1}/I_{\lambda 2}$ is greater than a specifiable first threshold value and/or with the luminous gas if the ratio $I_{\lambda 1}/I_{\lambda 2}$ is less than a specifiable second threshold value.

11. The device of claim 10, wherein:
    the at least one light sensitive element includes a first light-sensitive element and a second light-sensitive element;

and further comprising:

a first optical filter disposed in front of first light-sensitive element; and a second optical filter disposed in front of the second light-sensitive element, wherein the first optical filter predominantly allows light at the first wavelength $\lambda 1$ to pass through and wherein the second optical filter predominantly allows light at the second wavelength $\lambda 2$ to pass though.

12. The device of claim 11, wherein the first and/or second optical filter is/are configured as a band-pass filter.

13. The device of claim 12, wherein a maximum transparency of the first optical filter is in a wavelength range of from 300 to 400 nm, and wherein a maximum transparency of the second optical filter is in a wavelength range of from 650 to 750 nm.

14. The device of claim 10 further comprising:

an output configured to issue a first alarm/switching signal in the event of the arc being detected in a monitoring region and/or a second alarm/switching signal in the event of the luminous gas being detected in the monitoring region and/or a third alarm/switching signal in the event that light sensed in the monitoring region can be associated neither with the arc nor with the luminous gas.

15. As switch cabinet, comprising:

a switching device including the device of claim 14, wherein the device includes an output connected to a switch input of the switching device to issue the first alarm/switching signal.

* * * * *